Figure 1:
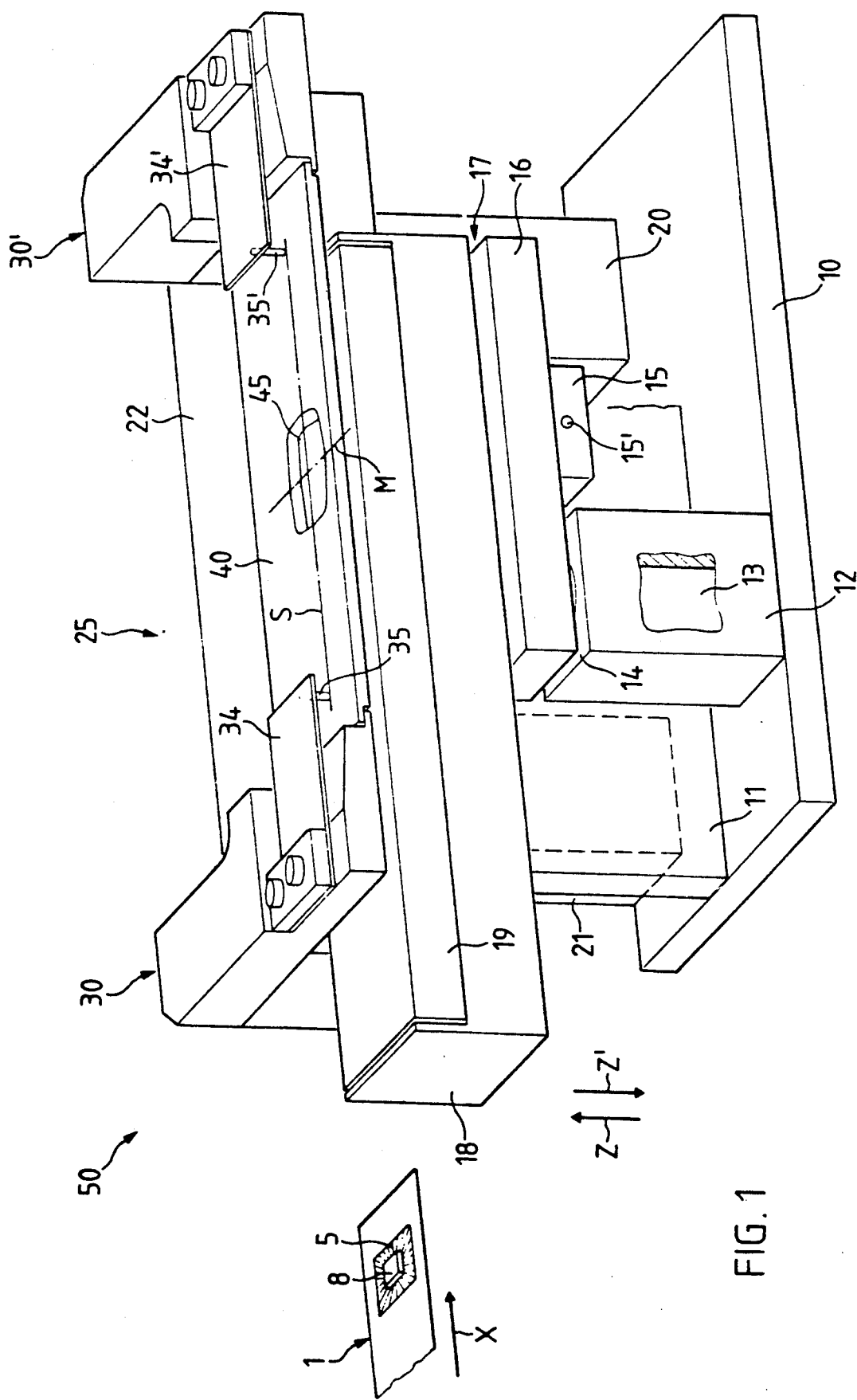

United States Patent [19]
Japichino et al.

[11] Patent Number: 5,108,023
[45] Date of Patent: Apr. 28, 1992

[54] DEVICE FOR FORMING ELECTRIC CIRCUITS ON A LEAD FRAME

[75] Inventors: Emanuele Japichino, Schwyz; Walter Nehls, Steinhausen, both of Switzerland

[73] Assignee: Esec SA, Cham, Switzerland

[21] Appl. No.: 603,986

[22] Filed: Oct. 26, 1990

[30] Foreign Application Priority Data

Nov. 14, 1989 [CH] Switzerland ............... 4090/89

[51] Int. Cl.⁵ .................. B23K 37/04; B23K 1/06
[52] U.S. Cl. .................. 228/6.2; 269/254 R; 269/903; 228/44.7; 228/1.1
[58] Field of Search .............. 228/1.1, 6.2, 44.7, 228/49.1, 180.2, 212; 269/903, 254 R

[56] References Cited

U.S. PATENT DOCUMENTS

| | | | |
|---|---|---|---|
| 2,432,137 | 12/1947 | Burke | 269/254 |
| 3,628,717 | 12/1971 | Lynch et al. | 228/6.2 |
| 3,809,860 | 5/1974 | Diepeveen | 228/6.2 |
| 3,823,863 | 7/1973 | Piechocki | 228/6.2 |
| 3,858,784 | 1/1975 | Diepeveen | 228/6.2 |
| 3,905,862 | 9/1975 | Takahashi et al. | 228/1.1 |
| 4,099,660 | 7/1978 | Schultz et al. | 228/6.2 |
| 4,527,620 | 7/1985 | Pedersen et al. | 269/903 |
| 4,550,871 | 11/1985 | Chan et al. | 228/602 |
| 4,709,847 | 12/1987 | Koller | 228/49.1 |
| 4,896,811 | 1/1990 | Dunn et al. | 228/6.2 |

FOREIGN PATENT DOCUMENTS

0128131 6/1987 Japan ...................... 228/212

*Primary Examiner*—Kurt Rowan
*Assistant Examiner*—Jeffrey T. Knapp
*Attorney, Agent, or Firm*—Carl J. Evens

[57] ABSTRACT

The present invention relates to a device for forming electric circuits on a lead frame, which has a plurality of process points in a row, each of which is provided with a semiconductor chip. During bonding, for achieving an optimum ultrasonic power transfer necessary for the electric connection of the semiconductor chip (8) to the connection fingers (5) of the lead frame, the individual lead frame (1) is located between a heated bearing element (19) and a correspondingly constructed holding plate (40). In the case of the device (50) according to the invention, the holding plate (40) provided for a contacting member (transducer) with a correspondingly constructed window-like recess (45) is movably mounted relative to the bearing element (19) about at least one axis (S) oriented in the longitudinal direction of the holding plate (40) on two spaced studs (35, 35'), each of which is arranged on a spring element (34, 34'). The axis (S) passes through the center of the recess (45) and interconnects the two studs (35, 35').

9 Claims, 3 Drawing Sheets

DEVICE FOR FORMING ELECTRIC CIRCUITS ON A LEAD FRAME

The present invention relates to a device for forming electric circuits on a lead frame, which is provided with at least one electronic component located in a process point and a plurality of connection fingers arranged around the process point and for effecting the electrical connection of the individual connection fingers to the electronic component is arranged between a heated bearing element and a holding plate provided with at least one recess.

In the automation of processing sequences, particularly when forming electric circuits on a relatively thin, metallic, lead frame strip, the problem arises that the contact ends of the connection fingers having the most varied designs and arranged roughly uniformly about a chip bearing surface (process point) and which are extremely closely juxtaposed must be held in a positionally stable manner during bonding (ultrasonic bonding) in order to obtain a completely satisfactory connection of the chip to the connection finger. In order to obtain an optimum ultrasonic power transfer and a corresponding heat transfer, it is necessary to uniformly press the lead frame against the bearing element without damaging the same. The problem of the invention, namely during ultrasonic bonding to hold the lead frame with the individual contact ends of the connection fingers in positionally stable manner on the bearing element, is solved according to the invention in that the holding plate resting on the lead frame is movably mounted on two spaced studs, each of which is located on a spring element, about at least one axis oriented in the longitudinal direction of the holding plate, passing through the centre of the recess and interconnecting the two studs.

Further features of the invention can be gathered from the following description in conjunction with the further claims and drawings, wherein show:

FIG. 1 Diagrammatically and perspectively the device for forming electric circuits on a lead frame loaded with electronic components.

Figure 2:
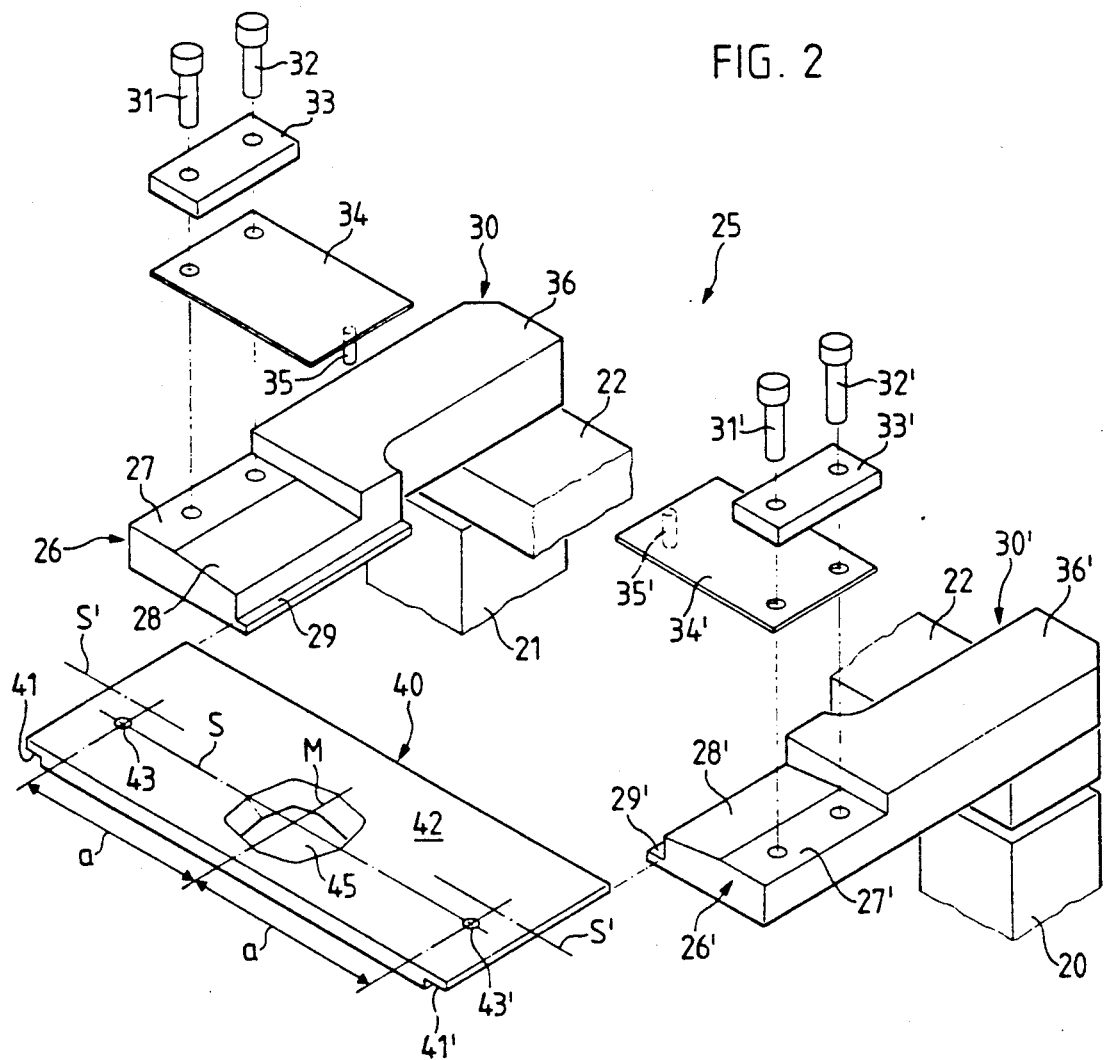

FIG. 2 A lead frame holding device for a device according to FIG. 1 shown in the form of an exploded view.

Figure 3:
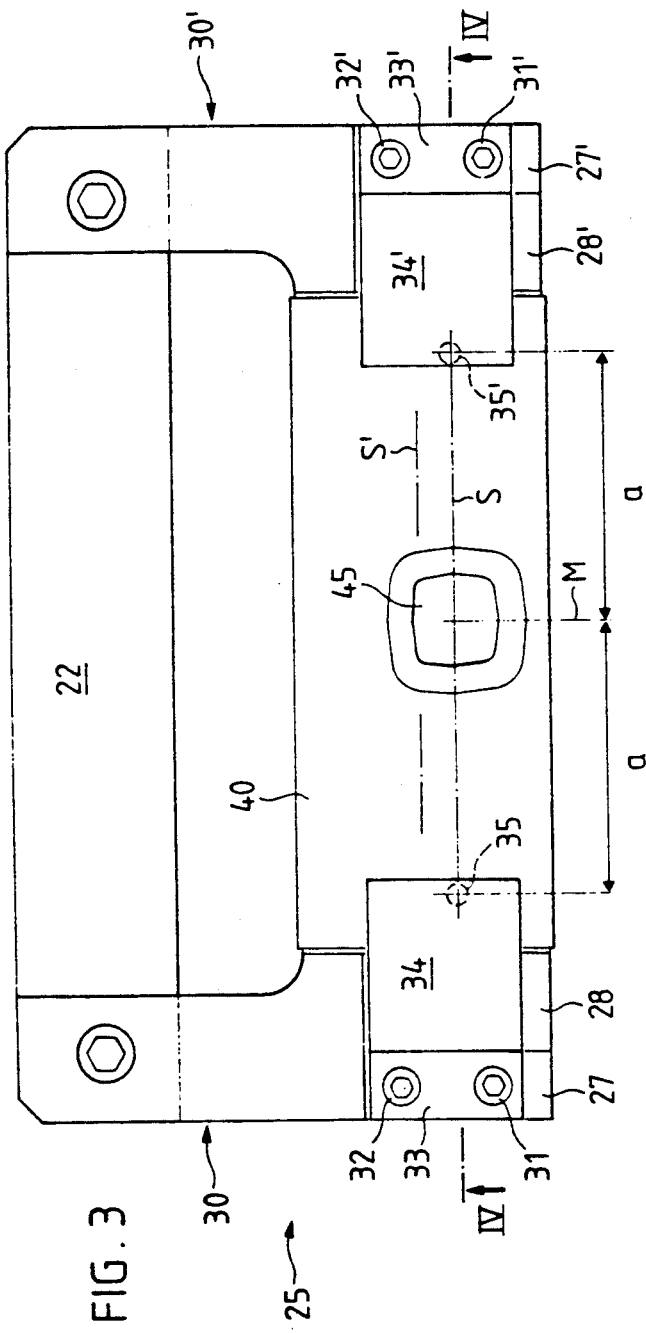

FIG. 3 The holding device according to FIG. 2 in plan view.

Figure 4:
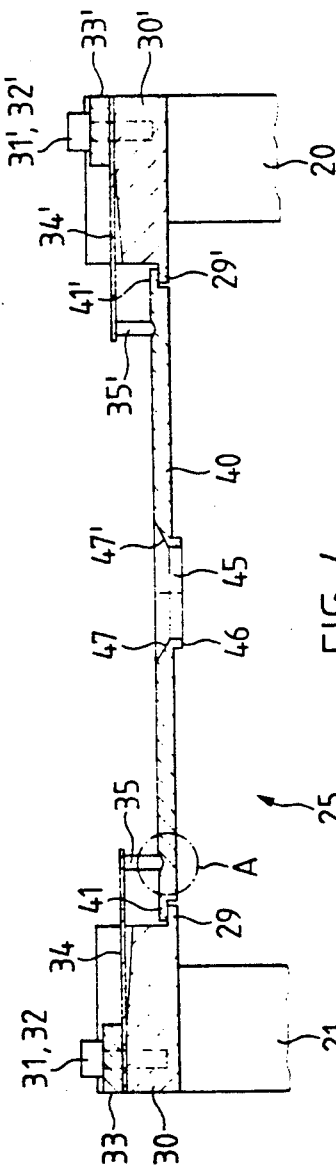

FIG. 4 The holding device shown in section along the line IV—IV of FIG. 3.

Figure 5:
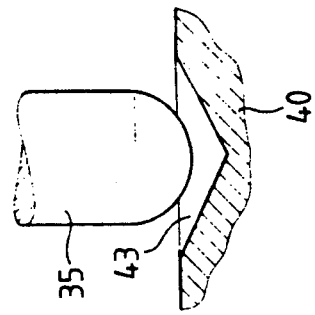

FIG. 5 A detail of the holding device indicated by a circle A and represented on a larger scale.

Figure 6:
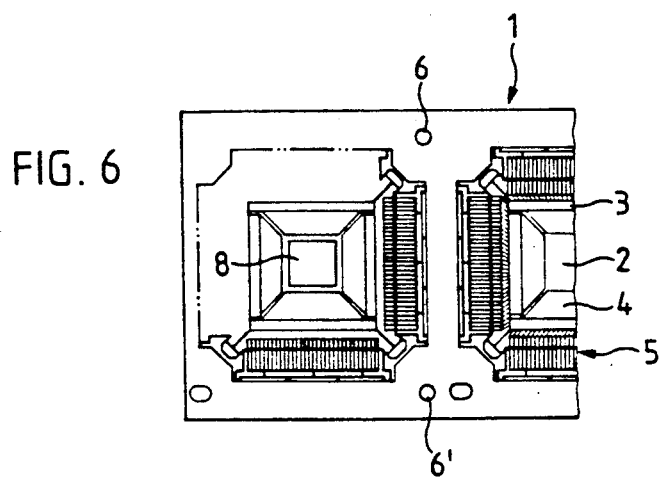

FIG. 6 A portion of the lead frame strip.

In order to generally illustrate the invention FIG. 1 perspectively shows a device 50 enabling electric circuits and connections to be produced on a lead frame strip 1 provided with electronic components or chips. The diagrammatically represented device 50 essentially comprises a base plate 10, a wall plate 11 arranged at right angles thereon, a correspondingly associated first upright 12 and a supporting plate 16. The supporting plate 16 is operatively connected to a bearing part 15 movably mounted about a diagrammatically represented axis 15'. The supporting plate arranged by means of the bearing part 15 at a limited distance 14 from the upright 12 is operatively connected to a rod 13 in not shown manner. The rod 13 is arranged and guided in the upright 12 fixed to the base plate 10.

At a distance 17 from the supporting plate 16 is provided a heater 18, which by not shown fixing elements (screw connection) is held on the supporting plate 16. On the heater 18 is located a bearing element 19 constructed in accordance with the lead frame 1 and which is heated by the heater 18 for the corresponding heating of the lead frame 1.

On the other side of the wall plate 11, which is only partly represented in FIG. 1, are provided two further, spaced uprights 20, 21 and are fixed by not shown means to the base plate 10. In the same way as for the upright 12, a not shown rod is located in each upright 20, 21. The two not shown rods are interconnected by a supporting plate 22. The supporting plate 22 receives a holding device 25 for the lead frame 1.

The lead frame holding device 25 will now be described in detail. FIG. 2 shows the holding device 25 in a perspective, exploded view and it is possible to see two spaced support arms 30, 30', between which is interchangeably arranged and held a holding plate 40 constructed in accordance with the lead frame 1. The two support arms 30, 30' are roughly identically constructed, so that for simplification purposes hereinafter only the construction of one support arm 30 is described.

The support arm 30 essentially comprises a first portion 36 and a second portion 26 shaped onto the first portion 36 and with the correspondingly constructed, first portion 36 is located on the supporting plate 22 and is fixed thereto by a screw connection not shown in FIG. 2. The portion 26 located in the front region on the support arm 30 and offset with respect to the first portion 36 is e.g. somewhat wider in profile cross-section than the first portion 36. The second portion 26 has a first bearing surface 27 and a second bearing surface 28 inclined with respect to the latter, together with a ledge 29 constructed for supporting the holding plate 40.

The holding plate 40 constructed in accordance with the lead frame 1 is provided with a recess 45 passing through said plate 40. In each end region of the holding plate 40 is provided a ledge 41, 41', which serves to engage on the ledge 29 of the support arm 30 or on the ledge 29' of the support arm 30'. Two spaced countersinks 43, 43' are provided on the top 42 of the holding plate 40 on a first axis S and equidistantly a from a second axis M of the recess 45.

It is pointed out here that the axis S passing centrally through the recess 45 and the countersinks 43, 43', in accordance with the construction of the lead frame 1 can be located on either side of the holding plate symmetry axis S' or on the symmetry axis S' of the holding plate 40. However, it is important that the two countersinks 43, 43' are located precisely on the first axis S and equidistantly a with respect to the second axis M of the recess 45. The second axis M is located precisely on the centre of the recess 45.

FIG. 2 also shows a plate-like spring element 34, as well as a plate-like holding piece 33 and two screws 31, 32. On the underside facing the holding plate 40 the spring element 34 is provided with a stud or bolt 35, which in the assembled state, as shown in FIGS. 1 and 4, engages in the correspondingly associated and constructed countersink 43 of the holding plate 40.

As has already been stated, the second support arm 30' has an identical construction to the first support arm 30 and the parts 34', 33', 32', 31' associated with the support arm 30' are, as shown in FIG. 2, constructed identically to the aforementioned parts 34, 33, 32, 31.

FIG. 3 shows the holding device 25 in plan view and it is possible to see the spaced support arms 30, 30', the holding plate 40 between them with the recess 45, as well as the two spring elements 34, 34' fixed to the support arm 30, 30' by means of screws 31, 32 and 31', 32'.

FIG. 4 shows the holding device 25 in section along line IV—IV of FIG. 3 and it is possible to see the two support arms 30, 30' and the interposed holding plate 40 engaging with the ledge 41, 41' on the ledge 29, 29' of the particular support arm 30, 30'. The two spring elements 34, 34' have a certain pretension and when the holding plate 40 is dismantled rest on the particular bearing surface 28, 28' of the support arm portion 26, 26'. When the holding plate 40 is fitted the spring elements 34, 34' are correspondingly deflected, cf. FIG. 4, so that in the fitted state the holding plate 40 is held by the resiliency of the spring elements 34, 34'. The studs or bolts 35, 35' fixed to the spring elements 34, 34' have engaged in the two countersinks 43, 43'. On the side facing the lead frame 1, which is not shown in FIG. 4, is provided on the holding plate 40 a closed bearing frame 46 arranged symmetrically to the recess 45 provided with the sloping sides 47, 47'. The bearing frame 46 is preferably shaped on to the holding plate 40.

FIG. 5 shows on a larger scale a detail of the holding plate 40 indicated by a circle A in FIG. 4 and it is possible to see the countersink 43 drilled at an angle of approximately 120° and the correspondingly associated stud or bolt 35 engaging in the countersink 43 in the assembled state and which is e.g. rounded at the end facing said countersink 43.

The countersink 43 or 43' shown in the drawings can also be constructed as a countersunk bore passing through the holding plate 40. It is important that the stud 35 or 35' is freely movably mounted on the conical face.

FIG. 6 shows a diagrammatically represented portion of the metallic lead frame strip 1, which is provided with bearing surfaces 2 arranged in a row and constructed for receiving diagrammatically represented semiconductor chips 8. The contact ends 4 of the connection fingers 5 forming a specific foot contour are arranged around the individual bearing surface 2 at an extremely small distance from one another. The connection fingers 5 are held in place by a bonded-on strip element 3. During bonding the connection fingers 5 are held in position by the bearing of the bearing frame 46 of the holding plate 40 constructed in accordance with the foot contour of the contact ends 4 and consequently completely satisfactory bonding is possible. The recess 45 in the holding plate 40 and also the bearing frame 46 is constructed in accordance with the foot contour of the contact ends 4 of the lead frame. The holes on the lateral edges and at specific periodic distances from one another have a specific spacing from the bearing surface 2, so that the holes 6, 6' in the feed movement to the means 50 (bonding station) oriented by the arrow X in FIG. 1 can be used as a reference geometry.

The means 50 functions as follows. As is diagrammatically indicated in FIG. 1, in order to form the electric circuit the individual lead frames 1 are supplied e.g. in synchronized controlled manner in arrow direction X to the means 50. Heater 18 with the bearing element 19 is slightly lowered in not shown manner by a movement in arrow direction Z and the holding device 25 with the holding plate 40 is slightly raised in arrow direction Z'. As soon as the first chip 8 on the lead frame 1 has reached the window-like recess 45, the heater 18 with the bearing element 19 is raised in arrow direction Z' and the holding device 25 with holding plate 40 is lowered in arrow direction Z. The movements of parts 18, 19 and 25, 40 are brought about by not shown, motor means and are synchronously oppositely directed on opening and closing.

As a result of the movable mounting of the holding plate 40 about both the first axis S and the second axis M, a uniform pressing of the lead frame 1 on the bearing element 19 is achieved and consequently by the contacting member (transducer) engaging in the recess 45 there is an optimum ultrasonic power transfer to the individual connection points. The spring-elastic mounting of the holding plate 40 permits a rapid replacement by another holding plate, whilst maintaining high reproducibility.

We claim:

1. Device for fixing electric circuits on a lead frame (1), which is provided with at least one electronic component located in a process point and a plurality of individual connection fingers (5) arranged around the process point, by effecting the electrical connection of the individual connection fingers (5) to the electronic component (8) is arranged between a heated bearing element (19) and a holding plate (40) provided with at least one recess (45), characterized in that the holding plate (40) for resting on the lead frame (1) is held between two spaced support arms (30, 30') and ledges (29, 29') respectively and two spaced studs (35, 35'), which engage corresponding countersinks (43, 43') of the holding plate (40), each stud (35, 35') is located on a spring element (34, 34') of the respective two spaced support arms (30, 30') and is movably mounted about an axis (S) oriented in the longitudinal direction of the holding plate (40), passing through the center of the recess (45) and about an axis (M) at right angles thereto also passing through the center of the recess (45).

2. Device according to claim 1, characterized in that on each recess (45) of the holding plate (40) on the side facing the lead frame (1) is provided a bearing frame (46) constructed in accordance with the foot contour (4) of the connection fingers (5).

3. Device according to claim 1, characterized in that the two support arms (30, 30') with the holding plate (40) engaging on the ledges (29, 29') through the resiliency of the spring elements (34, 34') is constructed as a holding device means (25).

4. Device according to claim 2, characterized in that the two support arms (30, 30') with the holding plate (40) engaging on the ledges (29, 29') through the resiliency of the spring elements (34, 34') is constructed as a holding device means (25).

5. Device according to claim 4, characterized in that the bearing element (19) located on a heater (18) and the holding device means (25) operatively connected to the holding plate (40) are vertically movable relative to one another.

6. Device for fixing electric circuits on a lead frame (1), which is provided an electronic component (8) located in a process point and a plurality of individual connection fingers (5) arranged around the process point, by effecting the electrical connection of the individual connection fingers (5) to the electronic component (8) between a heated bearing element (19) and a holding plate (40) provided with a recess (45), characterized in that the holding plate (40) for resting on the lead frame (1) is movably mounted on a holding device (25) having two spaced support arms (30, 30') with ledges (29, 29') respectively and spring elements (34, 34') with two spaced studs (35, 35') respectively located thereon, each ledge (29, 29') supports a respective ledge (41, 41') of the holding device (25) and each stud (35, 35') engages a respective countersink (43, 43') of the holding plate (40), the holding device (25) enabling movement about a first axis (S) oriented in the longitudinal direction of the holding plate (40), and about a second axis (M) at right angles thereto, both axes (S, M) passing through the center of the recess (45) of the holding plate (40).

7. Device according to claim 6, characterized in that on each recess (45) of the holding plate (40) on the side facing the lead frame (1) is provided a bearing frame (46) constructed in correspondence with the foot contour (4) of the connection finger (5).

8. Device according to claim 6, characterized in that the bearing element (19) located on the heater (18) and the holding device means (25) operatively connected to the holding plate (40) are vertically movable relative to one another.

9. Device for fixing electronic circuits on a lead frame (1), which is provided an electronic component (8) located in a process point and a plurality of individual connection fingers (5) arranged around the process point, by effecting the electrical connection of the individual connection fingers (5) to the electronic component (8) between a heated bearing element (19) and a holding plate (40) provided with a recess (45), characterized in that the holding plate (40) for resting on the lead frame (1) is movably mounted on a holding device (25) having two spaced support arms (30, 30') with ledges (29, 29') respectively and spring elements (34, 34') with two spaced studs (35, 35') respectively located thereon, each ledge (29, 29') supports a respective ledge (41, 41') of the holding device (40) and each stud (35, 35') engages a respective countersink (43, 43') of the holding plate (40), the holding device (25) enabling movement about a first axis (S) oriented in the longitudinal direction of the holding plate (40), and about a second axis (M) at right angles thereto, both axes (S, M) passing through the center of the recess (45) of the holding plate (40);

further characterized in that on each recess (45) has a side facing the lead frame (1) which has a bearing frame (46) constructed in correspondence with the foot contour (4) of the connection finger (5); and further characterized in that the bearing element (19) located on the heater (18) and the holding device means (25) operatively connected to the holding plate (40) are vertically movable relative to one another.

* * * * *